(12) United States Patent
Koyama et al.

(10) Patent No.: US 6,587,620 B2
(45) Date of Patent: Jul. 1, 2003

(54) SURFACE EMITTING DEVICE

(75) Inventors: Tomoko Koyama, Suwa (JP); Takeo Kaneko, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/878,994

(22) Filed: Jun. 13, 2001

(65) Prior Publication Data

US 2002/0018620 A1 Feb. 14, 2002

(30) Foreign Application Priority Data

Jun. 16, 2000 (JP) ........................................ 2000-182135

(51) Int. Cl.[7] ................................................. G02B 6/34
(52) U.S. Cl. ........................ 385/37; 385/10; 385/122; 372/45; 257/79
(58) Field of Search .......................... 385/37, 8, 9, 10, 385/14, 15, 40, 122, 129–132; 372/45, 43, 46; 257/98, 103, 94, 79

(56) References Cited

U.S. PATENT DOCUMENTS 6,462,356 B1 * 10/2002 Koyama et al. ............. 257/79

FOREIGN PATENT DOCUMENTS

| JP | A 63-70257 | 3/1988 |
|----|------------|--------|
| JP | A 63-175860 | 7/1988 |
| JP | A 1-221741 | 9/1989 |
| JP | A 2-51101 | 2/1990 |
| JP | A 2-135359 | 5/1990 |
| JP | A 2-135361 | 5/1990 |
| JP | A 3-152184 | 6/1991 |
| JP | A 5-39480 | 2/1993 |
| JP | A 5-297202 | 11/1993 |
| JP | A 6-201907 | 7/1994 |
| JP | A 6-224115 | 8/1994 |
| JP | A 7-20637 | 1/1995 |
| JP | A 7-181689 | 7/1995 |
| JP | A 7-235075 | 9/1995 |
| JP | A 8-15506 | 1/1996 |
| JP | A 8-248276 | 9/1996 |
| JP | A 9-178901 | 7/1997 |
| JP | A 9-211728 | 8/1997 |
| JP | A 9-311238 | 12/1997 |
| JP | A 10-8300 | 1/1998 |
| JP | A 10-26702 | 1/1998 |
| JP | A 10-59743 | 3/1998 |
| JP | A- 10-153967 | 6/1998 |
| JP | A 2000-35504 | 2/2000 |

OTHER PUBLICATIONS

U.S. patent application Ser. No. 09/531,330, Koyama et al., filed Mar. 20, 2000.
U.S. patent application Ser. No. 09/920,755, Koyama et al., filed Aug. 3, 2001.
U.S. patent application Ser. No. 09/795,435, Koyama et al., filed Mar. 1, 2001.
U.S. patent application Ser. No. 09/869,157, Koyama et al., filed Jun. 25, 2001.
U.S. patent application Ser. No. 09/762,614, Koyama et al., filed Feb. 9, 2001.

* cited by examiner

*Primary Examiner*—Phan T. H. Palmer
(74) *Attorney, Agent, or Firm*—Oliff & Berridge, PLC

(57) ABSTRACT

A surface-emitting device has a substrate and a light-emitting device section formed on the substrate, and emits light in a direction intersecting the substrate. The light-emitting device section includes a light-emitting layer, an anode and cathode for applying an electrical field to the light-emitting layer, and a grating.

23 Claims, 8 Drawing Sheets

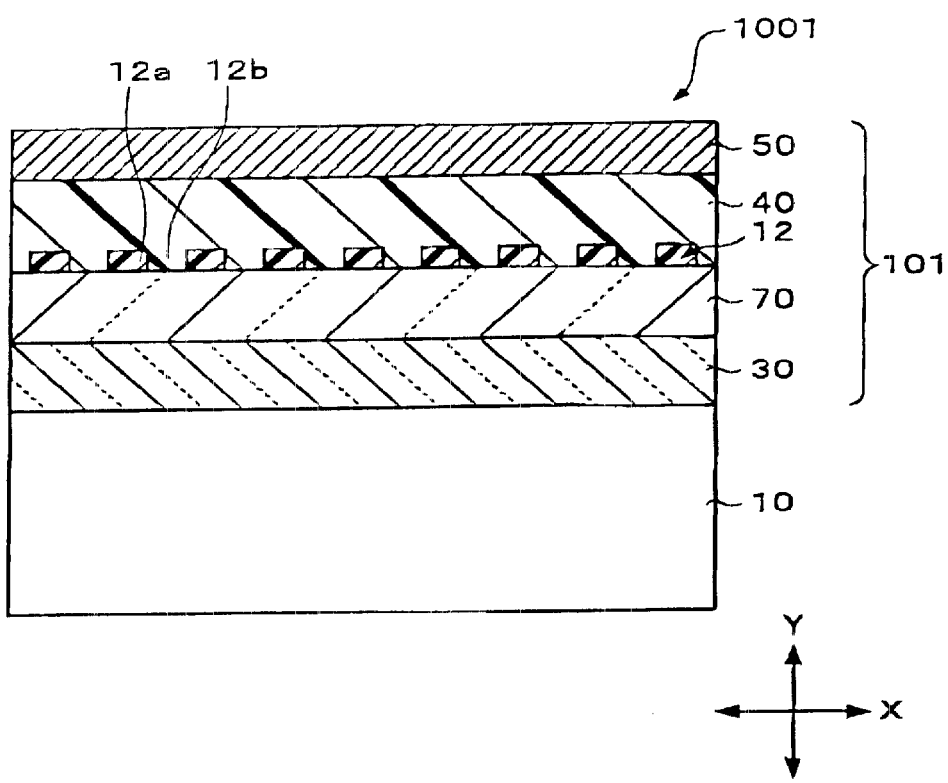
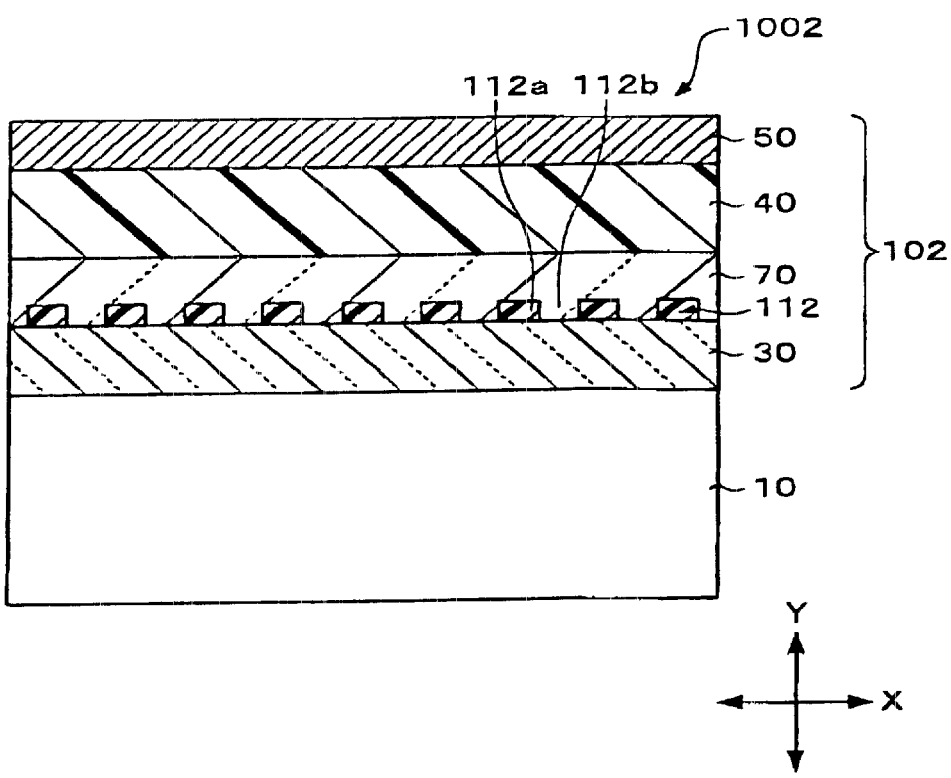

SURFACE EMITTING DEVICE

Japanese Patent Application No. 2000-182135, filed Jun. 16, 2000, is hereby incorporated by reference in its entirety.

TECHNICAL FIELD

The present invention relates to a surface-emitting device using electroluminescence.

BACKGROUND

An electroluminescence light-emitting element using electroluminescence has the problem that since the light is emitted isotropically and the directivity is poor, when viewed in a particular direction the light is of low strength, and light emission of high efficiency is not possible.

SUMMARY

The object of the present invention is the provision of a surface-emitting device capable of increasing the power of emitting light in a particular direction, and of making efficient use of the light.

The surface-emitting device of the present invention comprises a substrate and a light-emitting device section formed on the substrate, and emitting light in a direction intersecting the substrate,
wherein the light-emitting device section includes:
  a light-emitting layer capable of emitting light by electroluminescence;
  a pair of electrode layers for applying an electrical field to the light-emitting layer; and
  a grating of at least second order.

According to the surface-emitting device of the present invention, from the pair of electrode layers, that is, the cathode and anode, electrons and holes respectively are injected into the light-emitting layer, these electrons and holes recombine in the light-emitting layer, and when the molecules return from the excited state to the ground state, light is generated. According to the surface-emitting device of the present invention, since a grating of at least second order is included, light generated by the emitting layer is controlled by the grating to be emitted in a direction intersecting the substrate.

Here, a grating of at least second order refers to a grating, for example, such that if the pitch in the periodic direction of the grating is $(a+1) \lambda/2n$ ("a" is a positive integer, "n" is the mean refractive index). In particular, in the case of a grating of second order (a=1), a surface-emitting device can be obtained in which light is emitted not only in the direction of extension of the substrate 10 (the X-direction in FIG. 1), but in the film thickness direction of the substrate 10 (the Y-direction in FIG. 1).

A grating refers to an optical element generally used to obtain a particular spectrum using the diffraction of light.

In this case, in the above-described surface-emitting device of the present invention, the grating may form a photonic band gap or a photonic band approximating to the photonic band gap. Here a photonic band approximating to a photonic band gap refers to a band formed when a complete photonic band gap is not formed. For example, when the grating is formed by alternating arrays of the first medium layers and second medium layers, the photonic band gap may not be completely formed in the case where the difference in refractive index between the first medium layer and second medium layer is small.

According to this construction, from the pair of electrode layers, that is, the cathode and anode, electrons and holes respectively are injected into the light-emitting layer, these electrons and holes recombine in the light-emitting layer, and when the molecules return from the excited state to the ground state, light is generated. That is to say, within the light-emitting layer, the recombination of these electrons and holes generates excitons, and on the deactivation of these excitons, light in the form of fluorescence, phosphorescence, or the like is generated. By means of this, light of an extremely narrow emission spectral range can be obtained with high efficiency, and restricted spontaneous emission.

As examples of a surface-emitting device including the above described grating may be cited the following first and second surface-emitting devices.

First Surface-emitting Device

In the first surface-emitting device according to the above-described surface-emitting device of the present invention, the grating may be formed so that an energy level of an emission spectrum of the light-emitting layer includes a band edge energy level included within a band formed by the grating.

According to the first surface-emitting device, a band with respect to light is formed by the grating. This band provides a high state density with a given band edge energy. Here, the grating is constructed so that in the light-emitting layer, the energy level of the spectrum of the emitted light includes this band edge energy level, and therefore, in the light emitting layer the light emission at this band edge energy level is more easily attained. By means of this, light including the wavelength corresponding to this band edge energy level, and of a narrow spectral band is emitted, and an element with a high efficiency can be obtained.

Second Surface-emitting Device

The second surface-emitting device may comprise a defect formed in a part of the grating, and so that the energy level arising from the defect is within a given emission spectrum. According to this construction, of the light generated in the light-emitting layer, only the light of the wavelength band corresponding to the energy level arising from the defect can be propagated within the grating. Therefore, by determining the energy level width arising from the defect, light with natural emission regulated in a given direction, with an extremely narrow emission spectral range, and with directivity can be obtained with a high yield.

In this case, the light-emitting layer can function as at least part of the grating. In this case, the light-emitting layer may function as at least part of the defect.

In the above-described first and second surface-emitting devices, for example, the following configuration are possible.

(1) The grating may be a distributed feedback type grating, or a distributed Bragg reflection type, and further, may have a gain coupled structure or a refractive index coupled structure.

(2) The grating may have a first medium layer and a second medium layer disposed periodically and being insulated, and may have a periodic refractive index distribution in at least one direction. For example, there may be periodicity in one direction, in given two directions (first and second directions), or in given three directions (first, second, and third directions).

In this case, the surface-emitting device may comprise a plurality of the first medium layers, the first medium layers may have a columnar shape, and be disposed in a grid, and the second medium layer may be disposed between the first medium layer. Further in this case, the grating may have a pitch in a periodic direction of $(a+1) \lambda/2n$ ("a" is a positive integer and "n" is the mean refractive index).

(3) Further, at one of a hole transport layer and an electron transport layer may be provided.

In this case, the grating may have a single medium formed by the hole transport layer or the electron transport layer.

(4) The light-emitting layer may function as at least part of the grating.

(5) On at least one of the electrode layers, a layer regulating propagation of the light may be provided.

In this case, the layer regulating the propagation of light may be a cladding layer or a dielectric multilayer film.

(6) The light-emitting layer may be formed in a different region from the grating.

(7) The light-emitting layer may include an organic light-emitting material as a light-emitting material. By using an organic light-emitting material, compared with the use of for example a semiconductor material or inorganic material, the range of material available for selection is wider, and it is possible for light of various wavelengths to be emitted.

The above-described surface-emitting device of the present invention may be used for a display.

Examples are given of some materials that may be used in parts of the surface-emitting device of the present invention. These materials are only some well-known materials, and materials other than those cited by way of example can of course be selected.

Light-emitting Layer

The material of the light-emitting layer is selected from well known compounds for obtaining light of a particular wavelength. The material of the light-emitting layer may be either an organic compound or an inorganic compound, but from the point of view of large variety, and of ability to be formed into a film, can be an organic light-emitting material.

As such organic light-emitting materials can be used, for example, as disclosed in Japanese Patent Application Laid-Open No. 10-153967, aromatic diamine derivatives (TPD), oxydiazole derivatives (PBD), oxydiazole dimer (OXD-8), distyryl arylene derivatives (DSA), beryllium-benzoquinolinol complex (BeBq), triphenylamine derivatives (MTDATA), rubrene, quinacridone, triazole derivatives, polyphenylene, polyalkylfluorene, polyalkylthiophene, azomethine zinc complex, porphyrin zinc complex, benzoxazole zinc complex, phenanthroline-europium complex, and so on.

As the material of the light-emitting layer and may be used well-known materials such as those disclosed in Japanese Patent Application Laid-Open No. 63-70257, Japanese Patent Application Laid-Open No. 63-175860, Japanese Patent Application Laid-Open No. 2-135361, Japanese Patent Application Laid-Open No. 2-135359, Japanese Patent Application Laid-Open No. 3-152184, and further, Japanese Patent Application Laid-Open No. 8-248276 and Japanese Patent Application Laid-Open No. 10-153967. These compounds may be used singly or in combinations of two or more.

As examples of inorganic compounds may be cited ZnS:Mn (red region), ZnS:TbOF (green region), SrS:Cu, SrS:Ag, SrS:Ce (blue region), and so on may be cited.

Hole Transport Layer

When the light-emitting device section uses a light-emitting layer of an organic compound, if required, a hole transport layer can be provided between the electrode layer (anode) and light-emitting layer. The material used for the hole transport layer may be selected from well-known materials for injecting holes into a light propagating material, or well-known materials used in a hole injection layer in an organic surface-emitting device. The material of the hole transport layer has the function either of injecting holes or of obstructing electrons, and may be an organic or inorganic material. As a specific example, the material disclosed in, for example, Japanese Patent Application Laid-Open No. 8-248276 can be cited.

Electron Transport Layer

When the light-emitting device section uses a light-emitting layer of an organic compound, if required, an electron transport layer can be provided between the electrode layer (cathode) and light-emitting layer. The material of the electron transport layer should be such as to function to transport electrons injected from the cathode in the light-emitting layer, and this material can is be selected from well-known materials. As a specific example thereof, for example, can be cited the disclosure of Japanese Patent Application Laid-Open No. 8-248276.

Electrode Layers

As the cathode, a low work function (for example 4 eV or less) electron-injectability metal or metal alloy electrically conducting compound or combination thereof can be used. As such an electrode material, for example that disclosed in Japanese Patent Application Laid-Open No. 8-248276 can be used.

As the anode, a high work function (for example 4 eV or more) metal, metal alloy, electrically conducting compound or combination thereof can be used. When an optically transparent material is used as the anode, a transparent conducting material such as CuI, ITO, $SnO_2$, ZnO, or the like can be used, and when transparency is not required, a metal such as gold or the like can be used.

In the present invention, the method of forming the grating is not particularly restricted, and a well-known method can be used. The following are typical examples.

(1) Method of Lithography

A positive or negative resist is exposed to ultraviolet radiation, X-rays, or the like, and developed, to pattern a resist layer, whereby the grating is created. As patterning technology using a resist of polymethylmethacrylate or novolac type resin or the like, for example Japanese Patent Application Laid-Open No. 6-224115, or Japanese Patent Application Laid-Open No. 7-20637 may be cited.

As technology for patterning by photolithography with polyimide may be cited, for example, Japanese Patent Application Laid-Open No. 7-181689 and Japanese Patent Application Laid-Open No. 1-221741. Further, as technology for using laser ablation, to form grating of polymethylmethacrylate or titanium oxide on a glass substrate may be cited, for example, Japanese Patent Application Laid-Open No. 10-59743.

(2) Method of Forming a Refractive Index Distribution by Light Irradiation

A grating is formed by irradiating light of a wavelength such as to cause variation in the refractive index in a light guiding member of an optical waveguide, and periodically forming portions of a different refractive index in the light guiding member. As such a method, in particular, a layer of a polymer or polymer precursor is formed, is partially polymerized by light irradiation or the like, and regions of a different refractive index are periodically formed, and thus a grating can be formed. As examples of this type of technology may be cited, for example, Japanese Patent Application Laid-Open No. 9-311238, Japanese Patent Application Laid-Open No. 9-178901, Japanese Patent Application Laid-Open No. 8-15506, Japanese Patent Application Laid-Open No. 5-297202, Japanese Patent Application Laid-Open No. 5-39480, Japanese Patent Application Laid-Open No. 9-211728, Japanese Patent Application Laid-Open No. 10-26702, Japanese Patent Application Laid-Open No. 10-8300, and Japanese Patent Application Laid-Open No. 2-51101.

(3) Method of Stamping

A grating is formed by stamping, for example using a thermoplastic resin for hot stamping (Japanese Patent Application Laid-Open No. 6-201907), stamping using an ultraviolet radiation cured type of resin (Japanese Patent Application Laid-Open No. 2000-35504), stamping using an electron beam cured type of resin (Japanese Patent Application Laid-Open No. 7-235075), and the like.

(4) Method of Etching

Using lithography and etching technology, a thin film is selectively removed to form a pattern, and a grating formed.

Above, methods of formation of a grating have been described, but it is sufficient that the grating is formed with at least two regions of mutually different refractive indices, and for example, can be formed by the method of forming two regions from two materials of different refractive indices, the method of forming two regions by modifying parts of a single material to form regions of different refractive indices, and so on.

The various layers of the surface-emitting device can be formed by well-known methods. For example, for the layers of the surface-emitting device, an appropriate method of film formation is selected depending on the material, and as specific examples may be cited vapor deposition, spin coating, the LB method, an inkjet method, and so on.

BRIEF DESCRIPTION OF THE DRAWINGS

FIG. 3 is a schematic sectional view of a modification of the first embodiment of the surface-emitting device.

FIG. 4 is a schematic sectional view of a modification of the first embodiment of the surface-emitting device.

DETAILED DESCRIPTION

First Embodiment

Device Construction

Figure 1:
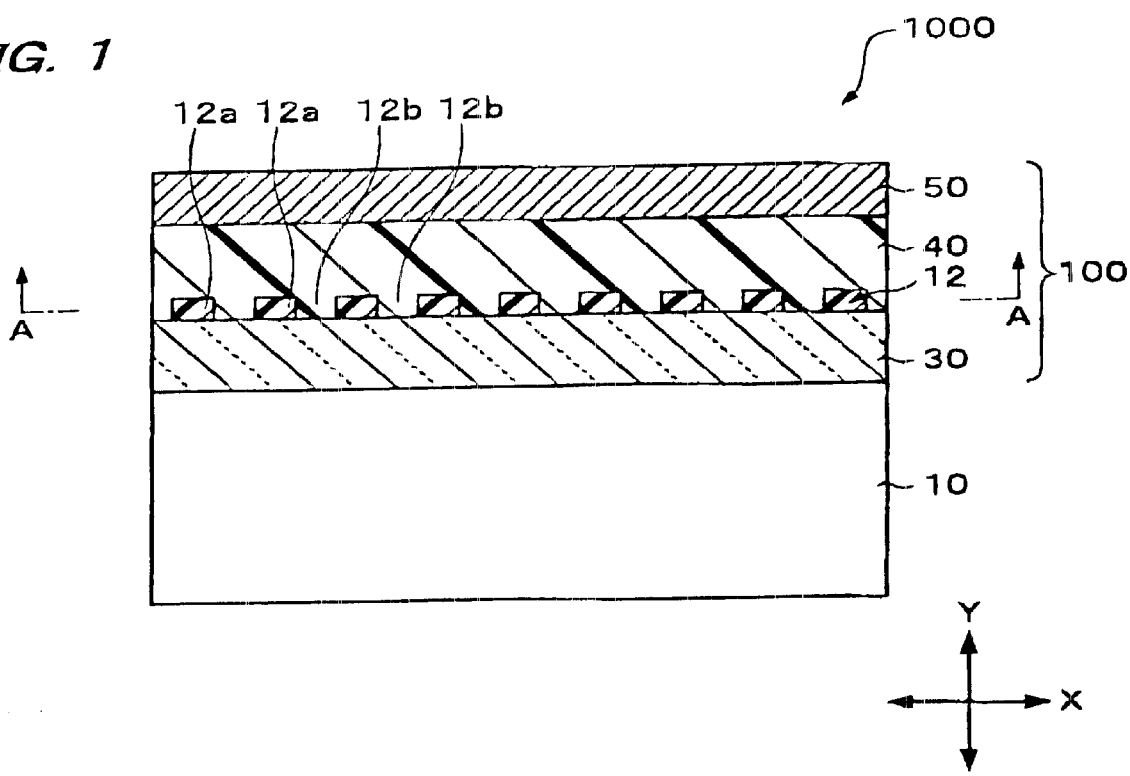
FIG. 1 is a schematic sectional view of a first embodiment of the surface-emitting device of the present invention.
Figure 2:
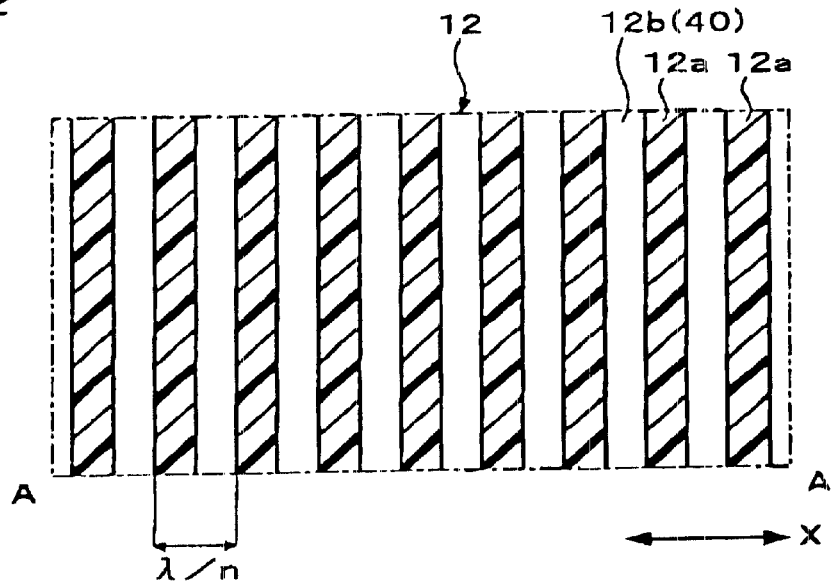
FIG. 2 is a section along the line A—A in FIG. 1.

FIG. 1 is a schematic sectional view of this embodiment of a surface-emitting device 1000, and FIG. 2 is a section along the line A—A in FIG. 1. FIGS. 3 to 7 are each sectional views of modifications of the surface-emitting device shown in FIG. 1.

The surface-emitting device 1000 comprises a substrate 10, and a light-emitting device section 100 formed on the substrate 10. The light-emitting device section 100 comprises an anode 30, a light-emitting layer 40, a cathode 50, and a grating 12. The light-emitting layer 40 is formed of a material capable of emitting light by electroluminescence. The anode 30 and cathode 50 are designed to apply an electrical field to the light-emitting layer 40.

The anode 30 is constructed of a transparent conducting material. As such a transparent electrode material can be used a above-described material such as ITO or the like.

The grating 12 has a periodic refractive index distribution in one direction. Here the term "grating" refers an optical element used conventionally to obtain a particular spectrum using the refraction of light, that is constructed with alternating layers of two media. In the grating 12, as shown in FIG. 2, a first medium layer 12a and a second medium layer 12b of different refractive indices are disposed alternatively in the X-direction. The second medium layer 12b is continuous with the light-emitting layer 40. That is to say, the light-emitting layer 40 functions as a part of the grating 12 (the second medium layer 12b).

The grating 12 is formed so that the pitch in the periodic direction is:

$(a+1) \lambda/2n$ ("a" is a positive integer, "n" is the mean refractive index)

In this case, the grating 12 is of (a+1)-th order. In FIGS. 1 and 2, since the pitch of the grating 12 in the periodic direction is $\lambda/n$ (a=1 in the above expression), the grating 12 is of second order. In FIG. 2, the pitch of the grating 12 in the periodic direction refers to the total width of an adjacent pair of portions of the first medium layer 12a and second medium layer 12b.

When the grating 12 is of second order or above, light is emitted not only in the direction of extension of the substrate 10, but also in the direction intersecting the substrate 10. In particular, as shown in FIG. 2, when the grating 12 is of second order, light is emitted in the direction of extension of the substrate 10 (the X-direction in FIG. 1), and in the film thickness direction of the substrate 10 (the Y-direction in FIG. 1). Based on the expression above, by causing the pitch of the grating 12 in the periodic direction to have a particular value, the order of the grating 12 can be determined.

The material of the first medium layer 12a constituting the grating 12 is not particularly restricted, and the first medium layer 12a is formed from a material selected from the variation generally used in a surface-emitting device. For example, the first medium layer 12a may be a gaseous layer of air or the like. In this way, when the optical member is formed with a gaseous layer, within the range of materials generally used for a surface-emitting device, the difference in refractive index between the two media constituting the optical member can be made large, and a grating of high efficiency for the desired light wavelength can be obtained. This modification can be applied in the same way to other embodiments.

The grating 12 used in the surface-emitting device 1000 of this embodiment constitutes a photonic band approximating to the photonic band gap. Further, the grating 12 is constructed so that the emission spectrum energy levels of the light-emitting layer 40 include the band edge energy level included in the band formed by the grating 12. That is to say, a band is formed with respect to the light by the grating 12. This band provides a high state density with a given band edge energy. The grating 12 is constructed so that in the light-emitting layer 40, the spectrum of the emitted light includes this band edge energy level. Therefore, in the light emission in the light-emitting layer 40, this band edge energy level is more easily attained. By means of this, a light of a narrow spectral band is emitted, including the wavelength corresponding to this band edge energy level, and an element with a high yield can be obtained.

The grating 12 uses a distributed feedback type grating. With excellent wavelength selectivity and directivity, light of a narrow emission spectral range can be obtained. Further, the grating 12 can have a refractive index coupling construction or a gain coupling construction. FIG. 1 shows the case in which the grating 12 has a gain coupling construction.

The cathode 50 is formed to cover the surface of the light-emitting layer 40. In this way, by forming the cathode 50 over the light-emitting layer 40, current can be supplied to be concentrated in the light-emitting layer 40, and current losses can be reduced.

It should be noted that in directions other than the direction of extension of the grating 12 (the X-direction in FIG. 1) and the direction intersecting the grating 12 (the Y-direction in FIG. 1) propagation of light in a leakage mode is permitted. For example, to limit the propagation of light in the direction of extension of the grating 12 (the X-direction in FIG. 1), as required, for example, a reflective layer not shown in the drawings may also be provided. This applies similarly to the modifications and other embodiments described below.

In respect of the method of manufacture of the grating 12 of the surface-emitting device 1000, the materials constituting the various layers, and so on, the above-described method, materials, and the like can be used as appropriate. In respect of these methods of manufacture and materials, this applies similarly to the modifications and other embodiments described below.

Device Operation

Next the operation and effect of this surface-emitting device 1000 is described.

By applying a given voltage to the anode 30 and cathode 50, electrons from the cathode 50, and holes from the anode 30 are each injected into the light-emitting layer 40. Within the light-emitting layer 40, the recombination of these electrons and holes generates excitons, and on the deactivation of these excitons, light in the form of fluorescence, phosphorescence, or the like is generated. The light generated in the light-emitting layer 40 is subject to a distributed feedback type of propagation by the grating 12, and is emitted in the direction of extension of the substrate 10 (the X-direction), and in the direction substantially perpendicular to the surface of the substrate 10 from the light-emitting layer 40 (the Y-direction).

Effect and Benefit

According to this embodiment of the surface-emitting device 1000, a grating of second order or more is included, whereby light generated in the light-emitting layer is controlled to be emitted not only in the direction of extension of the substrate 10, but also by the grating 12 in the direction intersecting the substrate 10.

In particular, when the grating 12 is of second order, as in the surface-emitting device 1000 of this embodiment, light is propagated not only in the direction of extension of the grating 12 (the X-direction in FIG. 1), but also to the same degree in the direction in which the layers are laminated on the substrate 10 (the Y-direction in FIG. 1). By means of this, so-called surface emission of light can be achieved.

Modifications

In the surface-emitting device 1000 shown in FIGS. 1 and 2, by varying position of formation of the grating 12 or the light-emitting layer 40, or by providing further layers, a surface-emitting device can be adopted which includes the constructions illustrated in FIGS. 3 to 7. In these figures, corresponding elements in the construction of the surface-emitting device 1000 are indicated with the same reference numerals, and detailed description is omitted. It should be noted that these modifications can be applied in the same way to other embodiments.

Each of FIGS. 3 to 7 is a schematic sectional view of a modification (surface-emitting devices 1001 to 1005 of the surface-emitting device of this embodiment.

(a) A surface-emitting device 1001 shown in FIG. 3 differs in that the light-emitting device section 101 includes a hole transport layer 70 from the surface-emitting device 1000 in which no such hole transport layer is provided.

The surface-emitting device 1001 includes a substrate 10 and a light-emitting device section 101 formed on the substrate 10. The light-emitting device section 101 has the anode 30, hole transport layer 70, light-emitting layer 40, and cathode 50 formed by lamination in this order on the substrate 10. The grating 12 is formed on the hole transport layer 70.

Next, the operation of this surface-emitting device 1001 is described.

By applying a given voltage to the anode 30 and cathode 50, electrons are injected into the light-emitting layer 40 from the cathode 50, and further, holes are injected into the light-emitting layer 40 from the anode 30 through the hole transport layer 70. Within the light-emitting layer 40, the recombination of these electrons and holes generates excitons, and on the deactivation of these excitons, light in the form of fluorescence, phosphorescence, or the like is generated. The remainder of the operation is substantially the same as in the first embodiment of the surface-emitting device 1000, and therefore description is omitted.

The surface-emitting device 1001 has the same effect and benefit as the surface-emitting device 1000 shown in FIG. 1 and furthermore, since the hole transport layer 70 is provided, the hole transport activity can be improved.

(b) A surface-emitting device 1002 shown in FIG. 4 differs from the surface-emitting device 1000 shown in FIG. 1 in that a light-emitting device section 102 includes a hole transport layer 70, and a second medium layer 112b constituting a grating 112 is continuous with the hole transport layer 70.

The surface-emitting device 1002 includes a substrate 10 and a light-emitting device section 102 formed on the substrate 10. The light-emitting device section 102 has the anode 30, hole transport layer 70, light-emitting layer 40, and cathode 50 formed by lamination in this order on the substrate 10.

The grating 112b is formed on the anode 30. The second medium layer 112b constituting the grating 112 is formed to be continuous with the hole transport layer 70. That is to say, hole transport layer 70 functions as a part (the second medium layer 112b) of the grating 112.

Next, the operation of this surface-emitting device 1002 is described.

By applying a given voltage to the anode 30 and cathode 50, electrons are injected into the light-emitting layer 40 from the cathode 50, and further, holes are injected into the light-emitting layer 40 from the anode 30 through the hole transport layer 70. Within the light-emitting layer 40, the recombination of these electrons and holes generates excitons, and on the deactivation of these excitons, light in the form of fluorescence, phosphorescence, or the like is generated. The remainder of the operation is substantially the same as that of the first embodiment of the surface-emitting device 1000.

The surface-emitting device 1002 has the same effect and benefit as the surface-emitting device 1001 shown in FIG. 3.

It should be noted that in FIG. 4, an example is shown in which the grating 112 is provided within the hole transport layer 70, but when the anode 30 is formed of a material other than a metal, and for example when formed of ITO, the grating may be formed from the hole transport layer 70 and anode 30.

Figure 5:
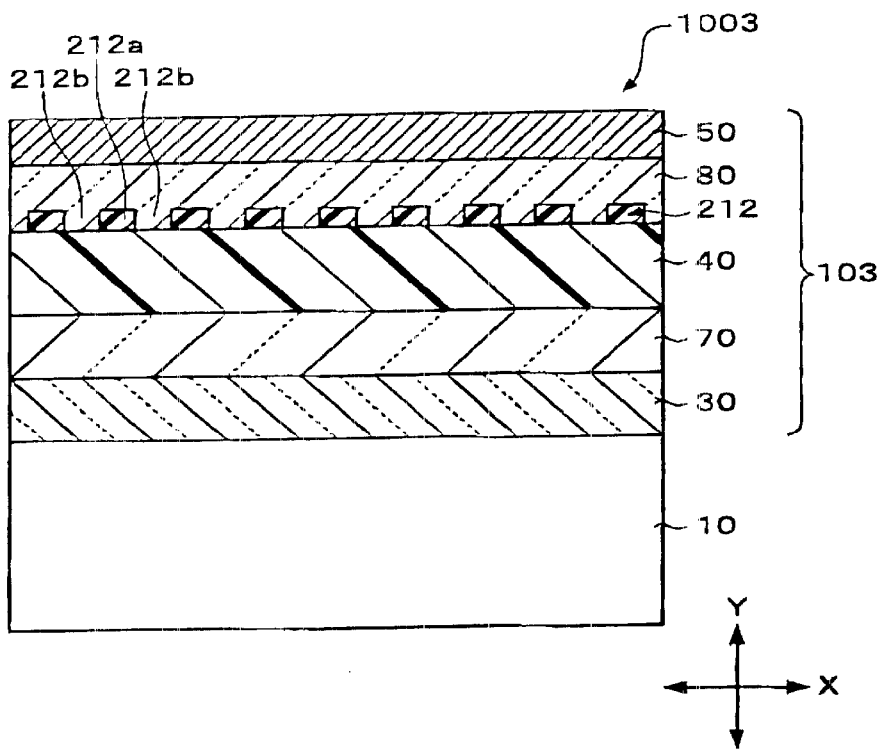
FIG. 5 is a schematic sectional view of a modification of the first embodiment of the surface-emitting device.

(c) A surface-emitting device 1003 shown in FIG. 5 differs from the surface-emitting device 1000 shown in FIG. 1 in that a hole transport layer 70 and electron transport layer 80 are included in a light-emitting device section 103, and a second medium layer 212b constituting the grating 212 is continuous with the electron transport layer 80.

The surface-emitting device 1003 includes a substrate 10 and the light-emitting device section 103 formed on the substrate 10. The light-emitting device section 103 has the anode 30, hole transport layer 70, light-emitting layer 40, electron transport layer 80, and cathode 50 formed in this order by lamination. The grating 212 is formed on the light-emitting layer 40, and the second medium layer 212b constituting the grating 212 is formed to be continuous with the electron transport layer 80. That is to say, the electron transport layer 80 functions as a part (the second medium layer 212b) of the grating 212.

Next, the operation of this surface-emitting device 1003 is described.

By applying a given voltage to the anode 30 and cathode 50, electrons are injected into the light-emitting layer 40 from the cathode 50 through the electron transport layer 80, and further, holes are injected into the light-emitting layer 40 from the anode 30 through the hole transport layer 70. Within the light-emitting layer 40, the recombination of these electrons and holes generates excitons, and on the deactivation of these excitons, light in the form of fluorescence, phosphorescence, or the like is generated. The remainder of the operation is substantially the same as that of the first embodiment of the surface-emitting device 1000.

The surface-emitting device 1003 has the same effect and benefit as the surface-emitting device 1000 shown in FIG. 1, and furthermore, since the hole transport layer 70 and electron transport layer 80 are provided, the transport activity of the holes and electrons can be improved.

It should be noted that in FIG. 5, an example is shown in which the grating 212 is provided within the electron transport layer 80. When the cathode 50 is formed of a material other than a metal, for example diamond or the like, the grating can be formed by the electron transport layer 80 and cathode 50. If no electron transport layer 80 is formed, the grating can also be formed by the cathode 50 and light-emitting layer 40.

Figure 6:
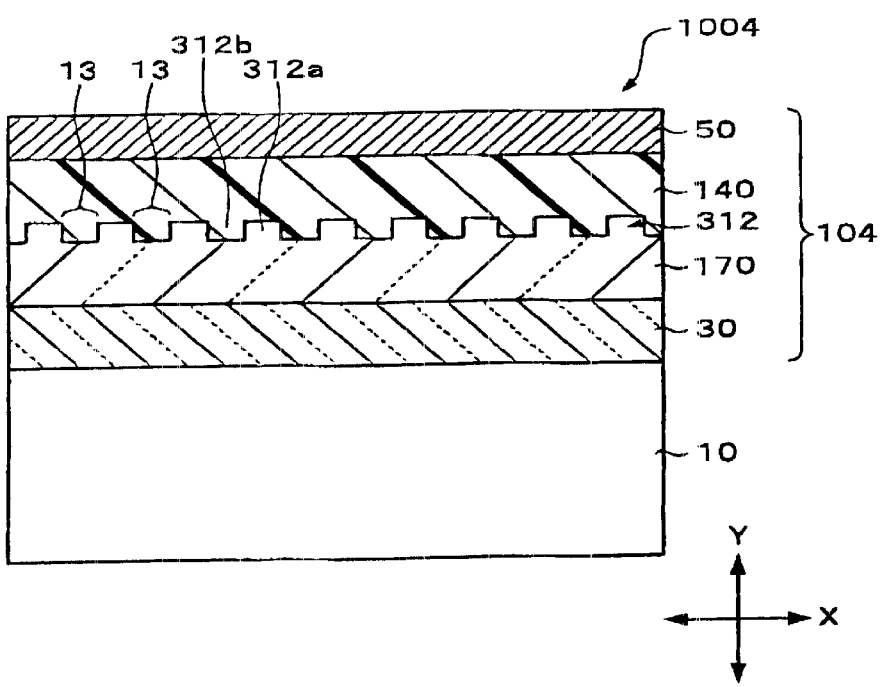
FIG. 6 is a schematic sectional view of a modification of the first embodiment of the surface-emitting device.

(d) A surface-emitting device 1004 shown in FIG. 6 differs from the surface-emitting device 1000 shown in FIG. 1 in that a light-emitting device section 104 includes a hole transport layer 170. The construction is similar to that of the surface-emitting device 1001 shown in FIG. 3 in that the hole transport layer 170 is included in the light-emitting device section 104, and the second medium layer 312b constituting a grating 312 is continuous with a light-emitting layer 140. On the other hand, this differs from the surface-emitting device 1001 shown in FIG. 3 in that a first medium layer 312a constituting the grating 312 is continuous with the hole transport layer 170.

The surface-emitting device 1004 includes a substrate 10 and a light-emitting device section 104 formed on the substrate 10. The light-emitting device 170, light-emitting layer 140, and cathode 50 formed in this order by lamination. The grating 312 is formed in the boundary region between the light-emitting layer 140 and the hole transport layer 170. That is to say, the grating 312 is formed by filling grooves 13 provided on the upper surface of the hole transport layer 170 with the material used to form the light-emitting layer 140. Therefore, the first medium layer 312a constituting the grating 312 is continuous with the hole transport layer 170. Therefore, the hole transport layer 170 functions as a part (the first medium layer 312a) of the grating 312. The second medium layer 312b constituting the grating 312 is continuous with the light-emitting layer 140. Therefore, the light-emitting layer 140 functions as a part (the second medium layer 312b) of the grating 312.

The operation, effect, and benefit of this surface-emitting device 1004 is the same as that of the surface-emitting device 1001 shown in FIG. 3, and therefore description is omitted.

Figure 7:
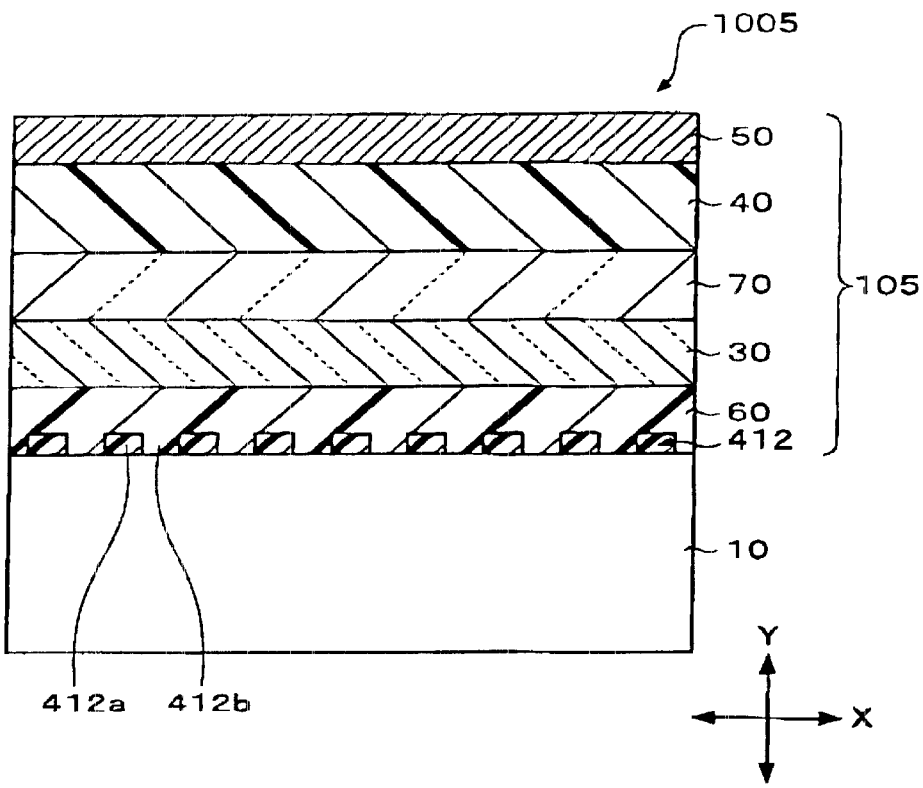
FIG. 7 is a schematic sectional view of a modification of the first embodiment of the surface-emitting device.

(e) A surface-emitting device 1005 shown in FIG. 7 differs from the above-described surface-emitting devices 1000 to 1004 in that a grating 412 has a refractive index distribution type of construction. The surface-emitting device 1005 has a construction similar to that of the surface-emitting device 1001 shown in FIG. 3, in that a light-emitting device section 105 includes the hole transport layer 70. On the other hand, this differs from the surface-emitting device 1001 shown in FIG. 3, in that the grating 412 is formed on the substrate 10.

The surface-emitting device 1005 includes a substrate 10 and a light-emitting device section 105 formed on the substrate 10. The light-emitting device section 105 has an insulating layer 60, the anode 30, hole transport layer 70, light-emitting layer 40, and cathode 50 formed in this order by lamination.

The grating 412 is constituted by a first medium layer 412a and a second medium layer 412b, and is of refractive index coupled structure. The first medium layer 412a is formed of the same material as the first medium layer 12a constituting the grating 12 shown in FIG. 1. The second medium layer 412b is continuous with the insulating layer 60. That is to say, the insulating layer 60 functions as a part (the second medium layer 412b) of the grating 412.

The operation, effect, and benefit of this surface-emitting device 1005 is substantially the same as that of the surface-emitting device 1001 shown in FIG. 3.

Second Embodiment

Device Construction

Figure 8:
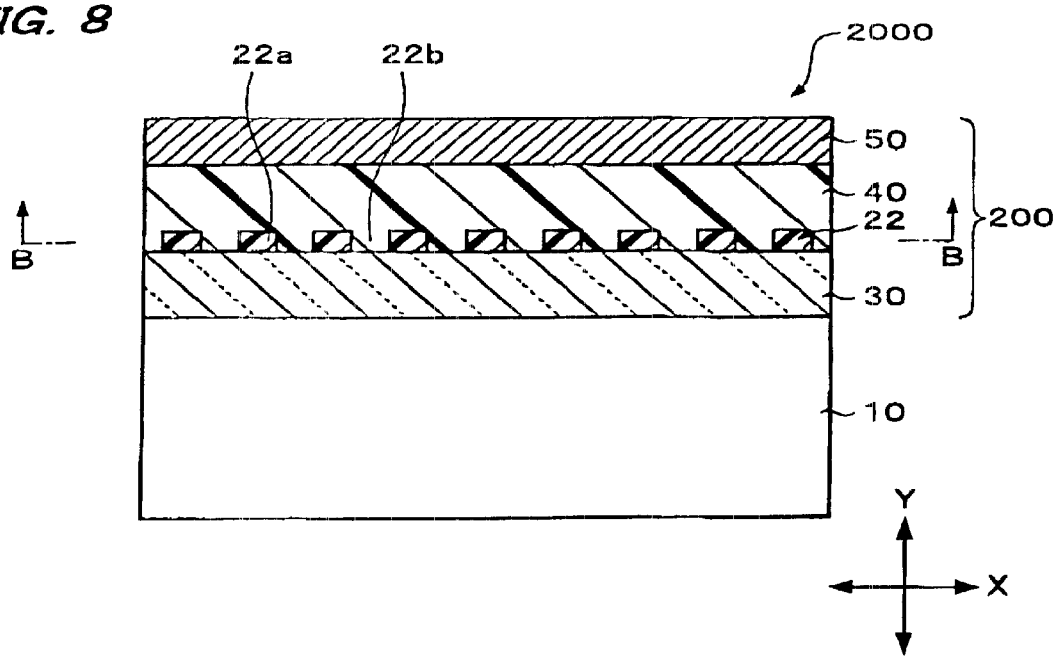
FIG. 8 is a schematic sectional view of a second embodiment of the surface-emitting device of the present invention.
Figure 9A:
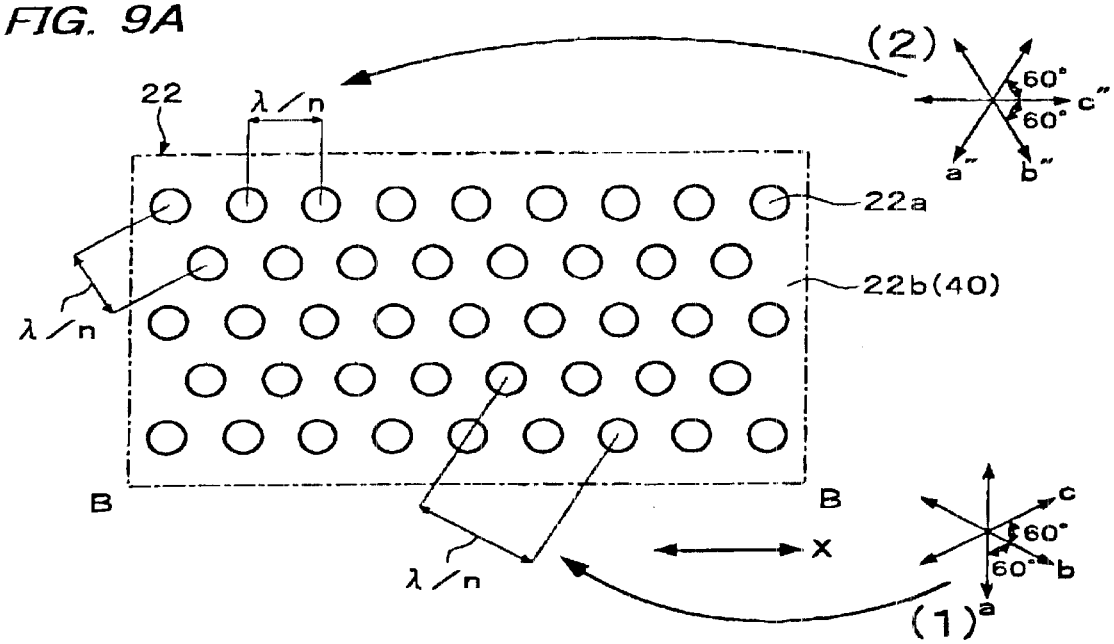
FIG. 9A is a section along the line B—B in FIG. 8.
Figure 9B:
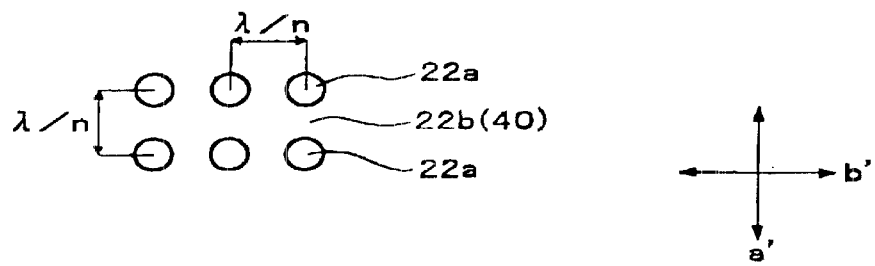
FIGS. 9B and 9C are each modifications of the grating shown in FIG. 9A.
Figure 9C:
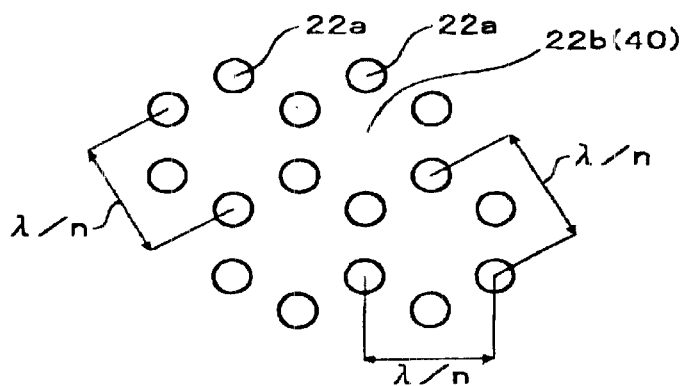

FIG. 8 is a sectional view schematically illustrating a surface-emitting device 2000 of this embodiment. FIG. 9A is a sectional view along the line B—B in FIG. 8, and FIGS. 9B and 9C are each figures illustrating modifications of a grating 22 shown in FIG. 9A.

The surface-emitting device 2000 differs from the surface-emitting device 1000 (first embodiment) including the grating 12 with a periodic refractive index distribution in a single direction, in having a grating 22 with a periodic refractive index distribution in first, second, and third directions. The remaining structural elements are substantially the same as in the first embodiment of the surface-emitting device 1000, and therefore description of these structural elements is omitted.

The grating 22, as above-described, has a periodic refractive index distribution in first, second, and third directions. That is to say, in the grating 22, as shown in FIG. 9A, a first medium layer 22a of a different refractive index is disposed in a in a triangular lattice. The first medium layer 22a has a columnar shape, and a second medium layer 22b is disposed between the first medium layers 22b. The second medium layer 22b is continuous with the light-emitting layer 40, in the same way as the second medium layer 22b in the first embodiment.

In the surface-emitting device 2000 of this embodiment, the pitch in the periodic directions of the grating 22 is $\lambda/n$ ("n" is the mean refractive index). It should be noted that when, as shown in FIG. 9A(1), the grating 22 has a periodic refractive index distribution in the a, b, and c directions, the pitch thereof, taken as the distance between centers adjacent but for one interposition in the first medium layer 22a is made to be $\lambda/n$. It should be noted that as shown in FIG. 9A (2), when the grating 22 has a periodic refractive index distribution in the a", b", and c" directions, the pitch thereof, taken as the distance between adjacent centers in the first medium layer 22a is made to be $\lambda/n$.

The grating 22, like the grating 12 in the first embodiment, is a grating of second order.

It should be noted that modifications of the grating 22 are shown in FIGS. 9B and 9C. FIG. 9B is an example in which the first medium layer 22a shown in FIG. 9A is disposed in a square lattice. In this case, there is a periodic refractive index distribution in first and second directions (a' and b' directions). In FIG. 9A (2) and FIG. 9B, the pitch in the periodic directions of the grating 22 refers to the spacing between adjacent centers in the first medium layer 22a.

FIG. 9C is an example in which the first medium layer 22a in FIG. 9A is disposed in a honeycomb lattice.

In both cases shown in FIGS. 9B and 9C, the grating is of second order. In FIG. 9B, the spacing between adjacent centers in the first medium layer 22a is $\lambda/n$. In FIG. 9C the spacing between centers adjacent but for one interposition in the first medium layer 22a is $\lambda/n$.

Device Operations

The operation of this surface-emitting device 2000 is the same as that of the surface-emitting device 1000 shown in FIG. 1, and therefore description is omitted.

Effect and Benefit

The surface-emitting device 2000 has the same effect and benefit as the surface-emitting device 1000 of the first embodiment, and furthermore, the surface-emitting device 2000 has the grating 22 with a periodic refractive index distribution in first, second and third directions, and therefore the propagation of light in these three directions is controlled. Therefore, since the propagation of light is further controlled compared with the surface-emitting device 1000 of the first embodiment which controls the propagation of light in one direction only, light with an extremely narrow emission spectral range can be obtained with high efficiency.

In the cases of the gratings shown in FIGS. 9B and 9C also, substantially the same effect and benefit as described above is present.

Third Embodiment

Device Construction

Figure 10:
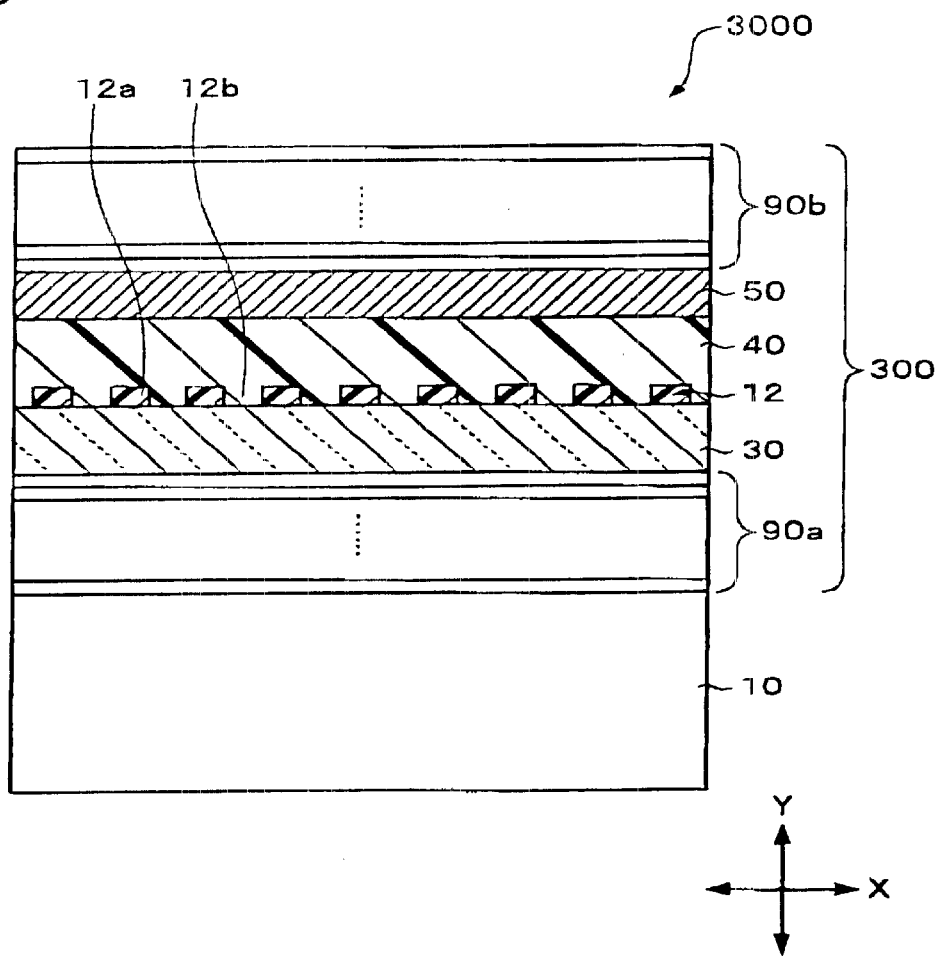
FIG. 10 is a schematic sectional view of a third embodiment of the surface-emitting device of the present invention.

FIG. 10 is a schematic sectional view of a surface-emitting device 3000 of this embodiment.

The surface-emitting device 3000 includes first and second dielectric multilayer films 90a and 90b in a light-emitting device section 300. As shown in FIG. 10, the first dielectric multilayer film 90a, anode 30, grating 12, light-emitting layer 40, cathode 50, and second dielectric multilayer film 90b, are disposed in this order on the substrate 10. That is to say, between the substrate 10 and the anode 30, and on the surface of the cathode 50 opposite to that on which the light-emitting layer 40 is formed, are formed first and second dielectric multilayer films 90a and 90b. It should be noted that in FIG. 10, the first and second dielectric multilayer films 90a and 90b are shown exaggerated. The constructional elements other than the first and second dielectric multilayer films 90a and 90b are substantially the same as in the first embodiment of the surface-emitting device 1000, and therefore description of these structural elements is omitted.

Device Operation

The operation of this surface-emitting device 3000 is substantially the same as that of the surface-emitting device 1000 shown in FIG. 1. That is to say, by applying a given voltage to the anode 30 and cathode 50, electrons from the cathode 50 and holes from the anode 30 are each injected into the light-emitting layer 40. Within the light-emitting layer 40, the recombination of these electrons and holes generates excitons, and on the deactivation of these excitons, light in the form of fluorescence, phosphorescence, or the like is generated. This generated light is emitted not only in the direction of extension of the substrate 10 (the X-direction in FIG. 10), but also from the light-emitting layer 40 in the film thickness direction of the substrate 10 (the Y-direction in FIG. 10).

Effect and Benefit

By means of the first and second dielectric multilayer films 90a and 90b, the propagation of light in the Y-direction in FIG. 10 is controlled. That is to say, by means of the first and second dielectric multilayer films 90a and 90b, the light can be controlled in the film thickness direction of the substrate 10. In this embodiment, since in addition to the grating 12, the propagation of light is controlled by the first and second dielectric multilayer films 90a and 90b, and the natural emission is regulated, in the film thickness direction of the substrate 10 also, light of an extremely narrow emission spectral range can be obtained with high efficiency, and restricted spontaneous emission.

In this embodiment, an example is shown in which the first and second dielectric multilayer films 90a and 90b are formed outside the anode 30 and cathode 50, but these dielectric multilayer films 90a and 90b are not restricted thereto, and may equally be layers of high reflectivity.

When the surface-emitting device of this embodiment is used for example in a display, to improve the efficiency of using the light, it is necessary for light to be emitted to the side of the substrate 10. In this case, with the surface-emitting device 3000 of this embodiment, since the dielectric multilayer film 90*b* is formed on the cathode 50, light emitted to the side of the cathode 50 can be reflected by the dielectric multilayer film 90*b*. Therefore, the light emitted from the cathode 50 side is reduced, and light can be preferentially emitted from the side of the substrate 10, thus allowing the efficiency of using the light to be increased.

In this case, it is preferable for the phase of light reflected on the side of the cathode 50 to be matched with that of light emitted directly to the side of the substrate 10.

In the surface-emitting device 3000, in place of the cathode 50 formed of a metal material, a CuPc (copper phthalocyanine) layer can be used. In this case, between the CuPc layer and the dielectric multilayer film 90*b*, a layer of ITO is provided.

It should be noted that the grating 12 is the same as the grating 12 formed on the first embodiment of the surface-emitting device 1000, but it is also possible to use the grating 22 (see FIGS. 9A to 9C) formed on the second embodiment of the surface-emitting device 2000.

Fourth Embodiment

Device Construction

Figure 11:
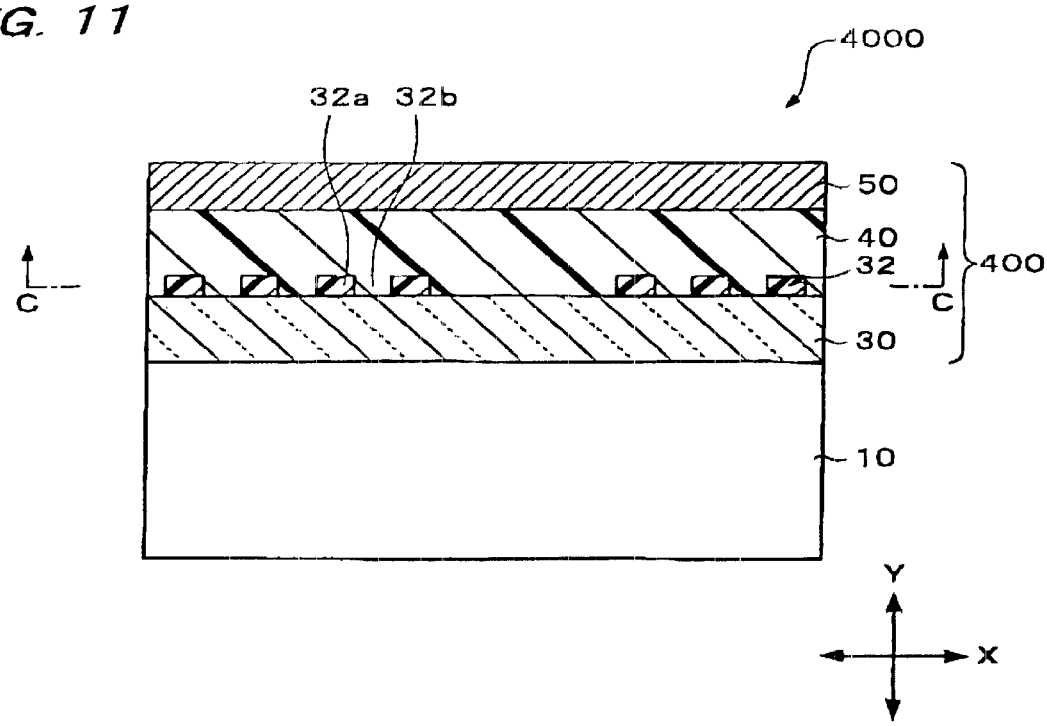
FIG. 11 is a schematic sectional view of a fourth embodiment of the surface-emitting device of the present invention.
Figure 12:
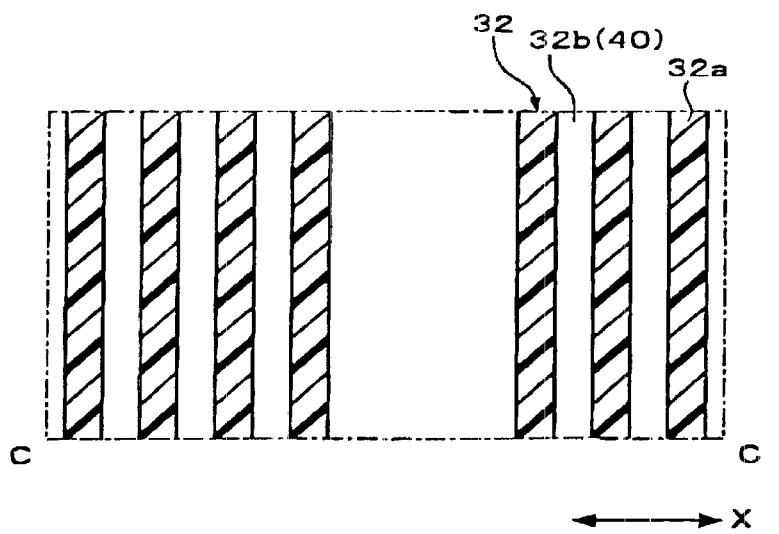
FIG. 12 is a section along the line C—C in FIG. 11.

FIG. 11 is a schematic sectional view of a surface-emitting device 4000 of this embodiment, and FIG. 12 is a section along the line C—C in FIG. 11. The surface-emitting device 4000 differs from the above described surface-emitting devices in having a distributed Bragg reflection grating.

The surface-emitting device 4000 includes a substrate 10 and a light-emitting device section 400 formed on the substrate 10. The light-emitting device section 400 has the anode 30, light-emitting layer 40, and cathode 50 formed by lamination in this order.

A grating 32 is formed at the boundary region between cathode 30 and the light-emitting layer 40, constituting a distributed Bragg type grating. By forming such a distributed Bragg type of grating 32 also, the light is caused to resonate, and light of excellent wavelength selectivity and directivity can be obtained.

Device Operation, Effect, and Benefit

The operation, effect and benefit of this surface-emitting device 4000 is substantially the same as that of the surface-emitting device 1000 shown in FIG. 1.

Fifth Embodiment

Device Construction

Figure 13:
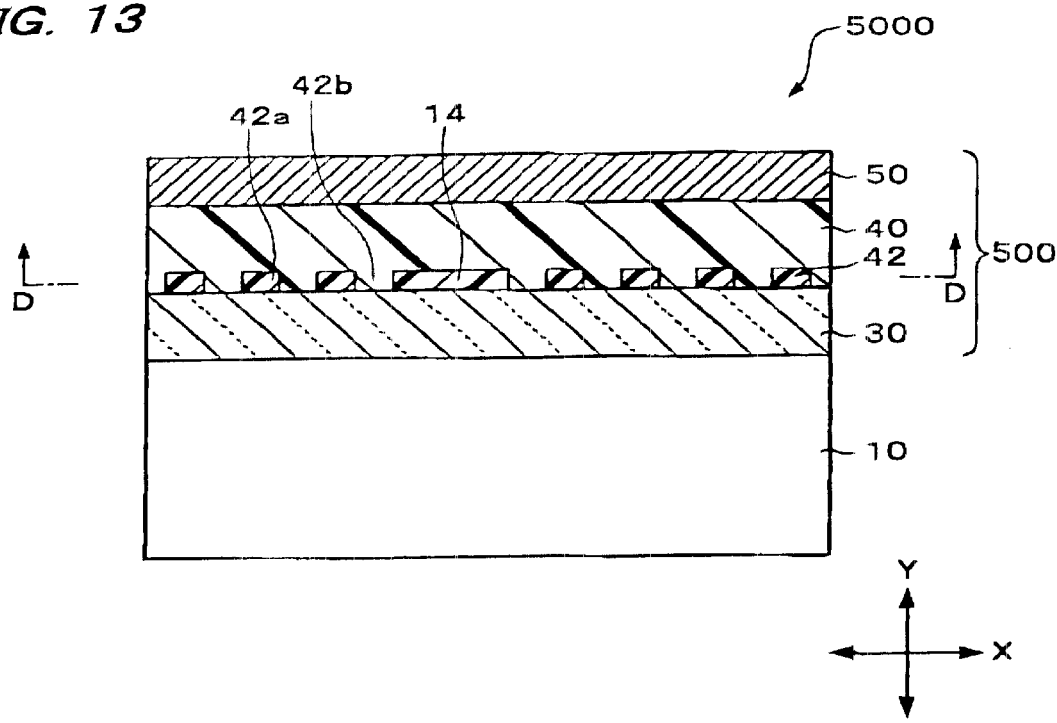
FIG. 13 is a schematic sectional view of a fifth embodiment of the surface-emitting device of the present invention.
Figure 14:
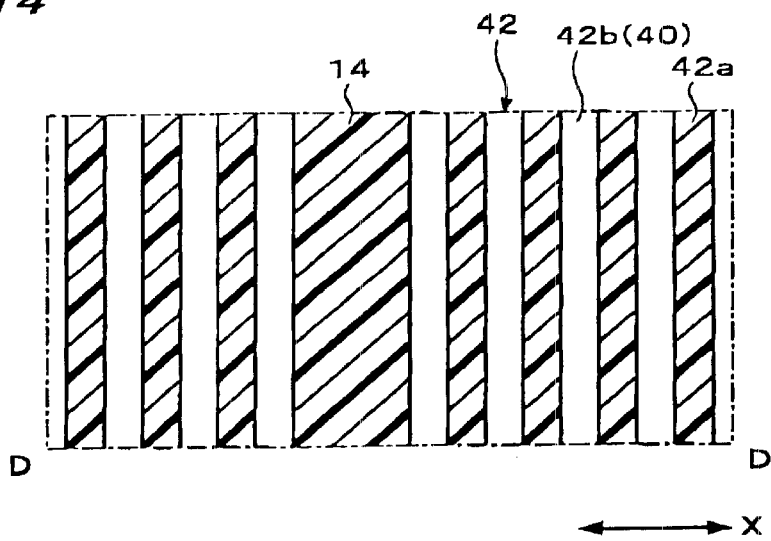
FIG. 14 is a section along the line D—D in FIG. 11.

FIG. 13 is a schematic sectional view of a surface-emitting device 5000 of this embodiment, and FIG. 14 is a section along the line D—D in FIG. 13. The surface-emitting device 5000 differs from the surface-emitting device in the above described first to fourth embodiments in that a grating 42 includes a defect 14.

The surface-emitting device 5000 includes a substrate 10 and a light-emitting device section 500 formed on the substrate 10. The light-emitting device section 500 includes the anode 30, light-emitting layer 40, cathode 50, and grating 42. It should be noted that of these structural elements, those with the same reference numerals are the same as structural elements of the first embodiment of the surface-emitting device 1000, and therefore description is omitted.

The surface-emitting device 5000 of this embodiment includes the grating 42 in a portion of which is formed the defect 14.

The grating 42 has a periodic refractive index distribution in one direction, and is the same as the grating 12 of the surface-emitting device 1000 of the first embodiment. That is to say, a first medium layer 42*a* and a second medium layer 42*b* of different refractive indices are disposed alternatively to constitute the grating 42.

The grating 42, in the same way as the grating 12 of the surface-emitting device 1000 of the first embodiment, has a pitch in this periodic direction of $\lambda/n$ (in the above-described expression, a=1), and therefore the grating 42 is of second order.

The grating 42, in the same way as the grating 12 of the surface-emitting device 1000 of the first embodiment, has the first medium layer 42*a* and second medium layer 42*b* of different refractive indices disposed alternatively, and the light-emitting layer 40 functions as a part of the grating 42 (the second medium layer 42*b*).

The grating 42 includes a defect 14. The first medium layer 42*a* is formed on both sides of the defect 14. Based on a combination of the form (dimensions) and medium thereof, the grating 42 is provided with a photonic band gap in respect of a particular wavelength range.

The defect 14 is formed so that the energy level arising from the defect is within the emission spectrum due to the current inducing of the light-emitting layer 40.

In this embodiment, an example is shown in which the defect 14 is formed of the same material as the first medium layer 42*a* constituting the grating 42, but as long as the first medium layer 42*a* is of a material such as to form a photonic band gap with the periodic distribution of the second medium 42*b*, there is no particular restriction on its composition. For example, the second medium layer may be a gas such as air or the like. In this way, when a grating of the so-called air gap construction is formed with the gaseous layer, a large difference in refractive index between the two media constituting the grating is possible within the range of materials generally used for forming the surface-emitting device.

The defect 14 may be formed by the second medium layer 42*b*. For example, in the surface-emitting device 5000 shown in FIG. 13, instead of providing the defect 14, in the region in which the defect 14 is formed a defect may be formed by filling in the light-emitting layer 40. In this case, the light-emitting layer 40 functions as a part of the defect.

The surface-emitting device 5000 of this embodiment has the light controlled by the grating 42, and therefore the light propagation is controlled both in the direction of extension of the grating 12 (the X-direction in FIG. 1) and in the film thickness direction of the substrate 10 (the Y-direction in FIG. 1).

It should be noted that not only in the surface-emitting device 5000 of this embodiment, but also in the modification of the first embodiment of the surface-emitting device (see FIGS. 3 to 7), and in the second to fourth embodiments of the surface-emitting device (see FIGS. 8 to 12), a surface-emitting device can also be formed with a grating including a defect as part thereof.

For example, in the surface-emitting device 4000 shown in FIG. 4, a defect can be provided in the grating. In this case, since the hole transport layer 70 functions as a part of the grating, the light-emitting layer 40 is formed in a different region from the grating.

Device Operation, Effect, and Benefit

Next, the operation, effect and benefit of this surface-emitting device 5000 are described.

By applying a given voltage to the anode 30 and cathode 50, electrons from the cathode 50 and holes from the anode 30 are injected into the light-emitting layer 40. Within the light-emitting layer 40, the recombination of these electrons and holes generates excitons. Then light in a wavelength band corresponding to the photonic band gap of the grating 42 cannot be propagated within the grating 42, the excitons return to the base state of the energy level arising due to the defect, and light is generated only in the wavelength band corresponding to this energy level. Therefore, light of an extremely narrow emission spectral range defined by the energy level arising due to the above described defect can be obtained with high efficiency.

What is claimed is:

1. A surface-emitting device comprising a substrate and a light-emitting device section formed on the substrate, and emitting light in a direction intersecting the substrate,
   wherein the light-emitting device section includes:
   a light-emitting layer capable of emitting light by electroluminescence;
   a pair of electrode layers for applying an electrical field to the light-emitting layer; and
   a grating of at least second order.

2. The surface-emitting device as defined in claim 1, wherein the grating has a first medium layer and a second medium layer disposed periodically and being insulated.

3. The surface-emitting device as defined in claim 2, comprising a plurality of the first medium layers, wherein the first medium layers have a columnar shape, and disposed in a grid, and wherein the second medium layer is disposed between the first medium layers.

4. The surface-emitting device as defined in claim 3, wherein the grating has a pitch in a periodic direction of (a+1) $\lambda/2n$ ("a" is a positive integer and "n" is the mean refractive index).

5. The surface-emitting device as defined in claim 2, wherein the grating has a periodic refractive index distribution in at least one direction.

6. The surface-emitting device as defined in claim 2, wherein the grating has a periodic refractive index distribution in first and second directions.

7. The surface-emitting device as defined in claim 2, wherein the grating has a periodic refractive index distribution in first, second and third directions.

8. The surface-emitting device as defined in claim 1, wherein the grating forms a photonic band gap or a photonic band approximating to the photonic band gap.

9. The surface-emitting device as defined in claim 8, comprising:
   a defect formed in a part of the grating, and so that the energy level arising from the defect is within a given emission spectrum.

10. The surface-emitting device as defined in claim 9, wherein the light-emitting layer functions as at least part of the defect.

11. The surface-emitting device as defined in claim 8, wherein the grating is formed so that an energy level of an emission spectrum of the light-emitting layer includes a band edge energy level included within a band formed by the grating.

12. The surface-emitting device as defined in claim 1, comprising at least one of a hole transport layer and an electron transport layer.

13. The surface-emitting device as defined in claim 12, wherein the grating has a single medium formed by the hole transport layer or the electron transport layer.

14. The surface-emitting device as defined in claim 1, wherein on at least one of the electrode layers, a layer regulating the propagation of light is provided.

15. The surface-emitting device as defined in claim 14, wherein the layer regulating the propagation of light is a cladding layer or a dielectric multilayer film.

16. The surface-emitting device as defined in claim 1, wherein the grating is a distributed feedback type grating.

17. The surface-emitting device as defined in claim 1, wherein the grating is a distributed Bragg reflection grating.

18. The surface-emitting device as defined in claim 1, wherein the grating has a gain coupled structure.

19. The surface-emitting device as defined in claim 1, wherein the grating has a refractive index coupled structure.

20. The surface-emitting device as defined in claim 1, wherein the light-emitting layer includes an organic light-emitting material as a light-emitting material.

21. The surface-emitting device as defined in claim 1, wherein the light-emitting layer functions as at least part of the grating.

22. The surface-emitting device as defined in claim 1, wherein the light-emitting layer is formed in a different region from the grating.

23. The surface-emitting device as defined in claim 1, being used for a display.

* * * * *